(12) United States Patent
Partch et al.

(10) Patent No.: US 7,182,798 B2
(45) Date of Patent: Feb. 27, 2007

(54) POLYMER-COATED PARTICLES FOR CHEMICAL MECHANICAL POLISHING

(75) Inventors: Richard E. Partch, Hannawa Falls, NY (US); Nathaniel A. Barney, Schenectady, NY (US); Hongyu Wang, Wilmington, DE (US); John Quanci, Haddonfield, NJ (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 0 days.

(21) Appl. No.: 10/903,425

(22) Filed: Jul. 29, 2004

(65) Prior Publication Data

US 2006/0032146 A1 Feb. 16, 2006

(51) Int. Cl.
*C09G 1/02* (2006.01)
*C09G 1/04* (2006.01)
*C09K 3/14* (2006.01)

(52) U.S. Cl. ............... 51/307; 51/308; 51/309; 51/298; 106/3

(58) Field of Classification Search ............ 51/307, 51/308, 298, 309; 106/3
See application file for complete search history.

(56) References Cited

U.S. PATENT DOCUMENTS

| RE31,388 E * | 9/1983 | Hellier et al. ............ 417/48 |
|---|---|---|
| 5,368,618 A | 11/1994 | Masmar et al. |
| 5,527,368 A | 6/1996 | Supkis et al. |
| 5,549,719 A | 8/1996 | Lee et al. |
| 5,556,437 A | 9/1996 | Lee et al. |
| 5,595,578 A | 1/1997 | Stubbs et al. |
| 5,833,724 A | 11/1998 | Wei et al. |
| 5,876,490 A * | 3/1999 | Ronay ............ 106/3 |
| 6,375,545 B1 | 4/2002 | Yano et al. |
| 6,561,876 B1 * | 5/2003 | Tateyama et al. ............ 451/41 |
| 6,730,245 B2 * | 5/2004 | Hampden-Smith et al. .... 264/7 |
| 2003/0124858 A1 * | 7/2003 | Nakabayashi et al. ....... 438/692 |
| 2003/0124959 A1 * | 7/2003 | Schroeder et al. ............ 451/41 |
| 2003/0168627 A1 * | 9/2003 | Singh et al. ............ 252/79.1 |
| 2004/0060472 A1 * | 4/2004 | Ronay ............ 106/3 |
| 2004/0060502 A1 | 4/2004 | Singh |
| 2004/0106361 A1 * | 6/2004 | Golzarian et al. ............ 451/41 |
| 2004/0151910 A1 * | 8/2004 | Koller et al. ............ 428/403 |

FOREIGN PATENT DOCUMENTS

| EP | 1 020 488 A2 | 7/2000 |
|---|---|---|
| EP | 1077 240 A1 | 2/2001 |
| EP | 1 123 956 A1 * | 8/2001 |
| WO | WO 99/56913 | 11/1999 |

OTHER PUBLICATIONS

Barney et al., "Potential Chemistries for Developing New Generation CMP Abrasives", Proceedings of the 5$^{th}$ International Symposium on Chemical-Mechanical Polishing, Aug. 2000.
Barney et al., "Coating and Functionalization of Particles for Improved Industrial Application": Surface Modification, Proceedings of the Particles 2001 Conference, Feb. 2001, Orlando, FL.
Partch et al., "Preparation and Evaluation of Chemically Modified Abrasives for CMP", abstract, 2001 MRS Spring Meeting, Session M2, CMP Abrasives I/CMP Abrasives II, Apr. 18, 2001, San Francisco, CA.
Barney et al., Surface Modification of Metal Oxide Particles for Enhancing Current Chemical Mechanical Polishing Techniques, Part 1 and Part 2, CAMP Annual Technical Meeting, May 2002, Saratoga Springs, NY.
Barney et al., "Surface Modification of Metal Oxide Particles for Enhancing Current Chemical-Mechanical Polishing Techniques", Proceedings of the 7$^{th}$ International Symposium on Chemical-Mechanical Polishing, Aug. 2002, Lake Placid, NY.
Partch et al., "Chemical Modification of Particle Surfaces: Probing for Possible CMP Applications", CMPUG Meeting, Oct. 10, 2002, San Jose, California.
Barney, "Particle Modification for Improving Existing Techniques and Creating New Possiblities for the Future" , Department of Chemistry Seminar, Clarkson University, Mar. 2003.

* cited by examiner

*Primary Examiner*—Michael Marcheschi
(74) *Attorney, Agent, or Firm*—Blake T. Biederman

(57) ABSTRACT

The polishing composition is suitable for chemical mechanical polishing magnetic, optical, semiconductor or silicon substrates. The polishing composition includes abrasive particles in a liquid media. The abrasive particles have a particle core, the particle core having a hardness and a polymeric shell physisorbed to and encapsulating the particle core. The polymeric shell has a solid structure and a hardness lower than the hardness of the particle core. The abrasive particles have an average particle size of less than or equal to about 2 micrometers dispersed in the liquid media.

8 Claims, No Drawings

POLYMER-COATED PARTICLES FOR CHEMICAL MECHANICAL POLISHING

BACKGROUND

This disclosure relates to the polishing of magnetic, optical, semiconductor and silicon wafers and more particularly, to polishing compositions and methods for polishing and planarizing silicon wafers.

The semiconductor industry uses interconnect metals in forming integrated circuits on semiconductor wafers. These interconnect metals are preferably non-ferrous metals. Suitable examples of such non-ferrous interconnects are aluminum, copper, gold, nickel, and platinum group metals, silver, tungsten and alloys comprising at least one of the foregoing metals. These interconnect metals have a low electrical resistivity. Copper metal interconnects provide excellent conductivity at a low cost. Because copper diffuses into many dielectric materials, such as silicon dioxide or doped versions of silicon dioxide, integrated circuit fabricators typically apply a diffusion barrier layer to prevent the copper diffusion into the dielectric layer. For example, barrier layers for protecting dielectrics include, tantalum, tantalum nitride, silicon nitride, tantalum-silicon nitrides, titanium, titanium nitrides, titanium-silicon nitrides, titanium-titanium nitrides, titanium-tungsten, tungsten, tungsten nitrides and tungsten-silicon nitrides.

In the manufacturing of semiconductor wafers, polishing compositions are used to polish semiconductor substrates after the deposition of the metal interconnect layers. Typically, the polishing process uses a "first-step" slurry specifically designed to rapidly remove the excessive interconnect metal. The polishing process then includes a "second-step" slurry to remove the barrier layer. The second-step slurry selectively removes the barrier layer without adversely impacting the physical structure or electrical properties of the interconnect structure. In addition to this, the second step slurry should also display low erosion for dielectrics.

While the "two-step" slurry generally performs satisfactorily in present conditions, it is desirable to have polishing compositions that can be used for planarizing the metal interconnect without substantial dishing of the interconnect metal and scratching of the wafer surface.

Preparation and evaluation of chemically modified abrasives for chemical mechanical polishing by Partch et al. in an abstract presented at Materials Research Society (MRS) meeting in 2001, discloses coating individual particle cores with a layer of organic or inorganic material. However, Partch et al., disclosed manufacturing the polishing composition with abrasive particles having a large particle size distribution that resulted in scratching and other forms of surface damage.

U.S. Pat. Pub. No. 2004/0060502 to Singh discloses a plurality of particles that may be coated by weakly or strongly adsorbing surfactants or polymer additives to a core particle. The polymers thus adsorbed onto the abrasive particles can desorb from the particles during the polishing process to alter polishing characteristics and possibly result in damage to the polished surface.

There thus remains an unsatisfied demand for polymer-coated particles suitable for chemical mechanical polishing of magnetic, optical, semiconductor or silicon substrates.

SUMMARY OF THE INVENTION

The invention provides a polishing composition suitable for chemical mechanical polishing magnetic, optical, semiconductor or silicon substrates comprising: abrasive particles in a liquid media, the abrasive particles having a particle core, the particle core having a hardness and a polymeric shell physisorbed to and encapsulating the particle core, the polymeric shell having a solid structure and a hardness lower than the hardness of the particle core; and wherein the abrasive particles have an average particle size of less than or equal to about 2 micrometers dispersed in the liquid media.

In another aspect, the invention provides a polishing composition suitable for chemical mechanical polishing magnetic, optical, semiconductor or silicon substrates comprising: abrasive particles in a liquid media, the abrasive particles having a particle core, the particle core having a hardness; a polymeric shell physisorbed to and encapsulating the particle core, the polymeric shell having a solid crosslinked structure, a hardness lower than the hardness of the particle core and a thickness of 0.5 to 20 nanometers; and wherein the abrasive particles have an average particle size of less than or equal to about 2 micrometers dispersed in the liquid media.

DETAILED DESCRIPTION OF PREFERRED EMBODIMENTS

The method produces polymer-coated particles useful for chemical mechanical polishing by first dispersing core particles in a non-aqueous solvent. Preferably, mixing or agitating the solvent maintains the particles in suspension. The non-aqueous solvent facilitates reacting a polymeric precursor to form a polymer. This polymer coats at least a portion of the surface of the core particles with the polymer to form the polymer-coated particles. Preferably the polymer-coated particle has a physisorbed structure surrounding the particle core. For purposes of this specification, physisorbed structure represents a coating lacking a chemical bond to the particle. The core particles have a hardness greater than the solid outer polymeric shell. Controlling the thickness of the polymeric shells allows the polymer-coated particles to achieve hybrid polishing properties different than polymer particles and different than conventional abrasive particles, such as alumina, ceria and silica.

Transferring the polymer-coated particles into an aqueous chemical mechanical polishing formulation without drying the polymer-coated particles reduces agglomeration and irreversible agglomeration experienced during drying. In addition, agglomeration arising from drying the polymer-coated particles has a significant detrimental impact upon yield and can produce coarse particles that adversely impact polishing. Specifically, maintaining the particles as a dispersion without drying facilitates dispersing the polymer-coated particles in aqueous solutions.

In one embodiment, during the manufacture of the abrasive particles, the outer polymeric shell may be crosslinked by employing crosslinkable monomers in the reactive dispersion. In another embodiment, the initiator may be added to the reactive dispersion in steps to control the thickness of the outer polymeric shell. In yet another embodiment, the non-aqueous solvent may be changed either during or after the reaction. The non-aqueous solvent used during the reaction can be advantageously selected so as to facilitate compatibilization of the abrasive particles with other fluids that may be used in the polishing composition.

The polymer-coated abrasive particles may be subsequently used in a polishing composition for polishing or planarizing substrates, such as magnetic, optical, semiconductor or silicon substrates. For example, the polymer-coated particles are particularly effective at polishing patterned semiconductor wafers. The polymer-coated abrasive particles comprise an inner particle core and an outer polymeric shell. The inner particle core has a higher hardness than the outer polymeric shell, and the polymeric shell advantageously reduces scratching on substrate surfaces. The inner particle core may comprise metals, metalloids, ceramics, intermetallics, organometallics, organoceramics, or a combination comprising at least one of the foregoing. The polymer-coated particles are manufactured by reacting a polymeric precursor in the presence of a particle core. After the reaction, additional liquids and other materials that are used for polishing semiconductor wafers such as water, corrosion inhibitors, oxidizing agents, chelating or complexing agents, other optional abrasive particles, may be added to the resulted dispersion in order to obtain the polishing composition.

Preferably, the particle core arises directly from a non-aqueous manufacturing process. This avoids the costs associated with an aqueous to non-aqueous solvent transfer process and facilitates maintaining a specific particle size distribution. The metals that may be used in the particle core are transition metals, main group metals, alkaline earth metals, rare earth metals, or a combination comprising at least one of the foregoing metals. Examples of suitable transition metals are iron, nickel, copper, titanium, zinc, molybdenum, or a combination comprising at least one of the foregoing transition metals. Examples of suitable alkaline earth metals are magnesium, calcium, strontium, barium, or a combination comprising at least one of the foregoing alkaline earth metals. Examples of suitable main group metals are aluminum, gallium, indium, tin, or a combination comprising at least one of the foregoing main group metals. Metalloids such as boron, silicon, germanium, tellurium, or a combination comprising at least one of the foregoing may be use as the particle core.

Ceramics may also be used to form the particle core. Examples of suitable ceramic particle cores include the following: inorganic oxides, inorganic hydroxides, inorganic oxides having hydroxide coatings, inorganic carbonates, metal carbides, metal nitrides, metal borides, or a combination comprising at least one of the foregoing particle cores. Particle cores may also comprise metal oxides coated with other metal oxides. Suitable inorganic oxides include, for example, silica ($SiO_2$), silica particles coated with aluminum hydrous oxide, ellipsoidal particles of different anisometry coated with silica, silica particles coated with ceria hydroxide particles, alumina ($Al_2O_3$), titania ($TiO_2$), zirconia ($ZrO_2$), ceria ($CeO_2$), manganese oxide ($MnO_2$), vanadium oxide (e.g., $V_2O_5$, $V_2O_3$, $VO_2$), zinc oxide (ZnO), iron oxides (e.g., FeO, $\alpha$-$Fe_2O_3$, $\gamma$-$Fe_2O_3$, $Fe_3O_4$), calcium oxide (CaO), manganese dioxide ($MnO_2$ and $Mn_3O_4$), alumina coated with silica, titania coated with zirconia, or combinations comprising at least one of the foregoing inorganic oxides. Examples of suitable inorganic carbides include silicon carbide (SiC), titanium carbide (TiC), tantalum carbide (TaC), tungsten carbide (WC), hafnium carbide (HfC), or a combination comprising at least one of the foregoing carbides. Nitrides such as silicon nitrides ($Si_3N_4$), titanium nitride (TiN) may also be used.

Examples of suitable borides are lanthanum boride ($LaB_6$), praseodymium boride ($PrB_6$), neodymium boride ($NdB_6$), cerium boride ($CeB_6$), gadolinium boride ($GdB_6$), terbium boride ($TbB_6$), dysprosium boride ($DyB_6$), holmium boride ($HoB_6$), yttrium boride ($YB_6$), samarium boride ($SmB_6$), europium boride ($EuB_6$), erbium boride ($ErB_6$), thulium boride ($TmB_6$), ytterbium boride ($YbB_6$), lutetium boride ($LuB_6$), strontium boride ($SrB_6$), calcium boride ($CaB_6$), titanium boride ($TiB_2$), zirconium boride ($ZrB_2$), hafnium boride ($HfB_2$), vanadium boride ($VB_2$), tantalum boride ($TaB_2$), chromium borides (CrB and $CrB_2$), molybdenum borides ($MoB_2$, $Mo_2B_5$ and MoB), tungsten boride ($W_2B_5$), or combinations comprising at least one of the foregoing borides. Diamond can also be advantageously used as the particle core. Ceramics such as inorganic carbonitrides, silicides, borocarbides, borosilicides, oxycarbonitrides, oxycarbides, may also be used. Preferred particle cores are those that comprise silica or alumina.

The coated particulate may be nanosized or micrometer sized and may comprise a single particle or multiple particles. When multiple particles agglomerate or aggregate to form the core, then it is still desirable that the cores be nanosized or micrometer sized as detailed below. There is no particular limitation to the shape of the particle cores, which may be for example, spherical, irregular, plate-like or whisker like. Micrometer sized cores may have average dimensions of less than or equal to about 2 micrometers ($\mu$m). (For purposes of this specification, particle size refers to the average particle size and all compositions represent weight percent, unless specifically noted otherwise.) In one embodiment, the micrometer sized polymer-coated particles have average particle sizes of less than or equal to about 1.50 $\mu$m. In another embodiment, the micrometer sized polymer-coated particles have average particle size of less than or equal to about 1.25 $\mu$m. Although "large" micron sized polymer-coated particles can assist polishing, sub-micron sized particle may have particular utility. For example, coated particles having an average particle size of 5 to 100 nanometers (nm) are particularly effective. Most preferably, the coated particles have an average particle size of 10 to 75 nm.

The particle cores may generally have average dimensions of less than or equal to about 1000 nanometers (nm). In one embodiment, the cores may have average dimensions of less than or equal to about 500 nm. In another embodiment, the cores may have average dimensions of less than or equal to about 100 nm. In yet another embodiment, the cores may have average dimensions of less than or equal to about 75 nm. In yet another embodiment, the cores may have average largest dimensions of less than or equal to about 50 nm. In yet another embodiment, the cores may have average largest dimensions of 5 to 20 nm. As stated above, the nanosized cores may generally have average dimensions of less than or equal to 200 nm. In one embodiment, more than 90% of the cores have average dimensions less than or equal to 200 nm. In another embodiment, more than 95% of the particles have average dimensions less than or equal to 200 nm. In yet another embodiment, more than 99% of the particles have average dimensions less than or equal to 200 nm with a unimodal distribution. A unimodal distribution is one that has a single mean for all the particles in the distribution, while a multimodal distribution has multiple means for all the particles in the distribution. Bimodal or higher particle size distributions may be used. Preferred cores are spherical in shape and colloidal in size, i.e., the average particle sizes are less than or equal to 100 nm.

The particle cores are present in the reactive dispersion in an amount of 0.1 to about 50 weight percent (wt %), based on the total weight of the reactive dispersion. In one embodiment, the particle cores are present in an amount of 0.5 to 30 wt %. In another embodiment, the particle cores are present in the reactive dispersion in an amount of 0.75 to about 20 wt %. In yet another embodiment, the particle cores are present in an amount of 1 to 10 wt %.

The particle cores possess a layer of polymer coating after the reaction in the reactive dispersion. The polymer coating is in an amount of 0.01 to 50 wt %, based on the total weight of the coated particles. In one embodiment, the polymer coating is present in an amount of 0.1 to 40 wt %. In another embodiment, the polymer coating is present in a amount of 0.5 to 30 wt %. In yet another embodiment, the polymer coating is present in an amount of 1 to 20 wt %.

The polymer coating on the surface of the particle cores have a thickness of 0.1 to 30 nanometers. In one embodiment, the thickness of the polymer coating is 0.5 to 20 nanometers. In another embodiment, the thickness of the polymer coating is 1 nanometer to 15 nanometers. In yet another embodiment, the thickness of the polymer coating is 5 nanometers to 10 nanometers.

The outer polymeric shell covers at least a portion of the outer surface of the particle core. Typically, the polymeric shell is softer than the particle core and therefore facilitates a reduction in the erosion, dishing and scratching during the polishing process. The outer polymeric shell may also be varied in thickness to control the removal rate of the metal interconnects or the barrier layer. The thickness and composition of the outer polymeric shell can be advantageously used to control the selectivity. The outer polymeric shell is generally derived by the reaction of a polymeric precursor in the presence of the core. The polymer precursors, as defined herein, comprise reactive species that are monomeric, oligomeric or polymeric that can undergo additional polymerization in the presence of the particle core.

The outer polymeric shell may be derived by the reaction of a monomer with another monomer or by the reaction of a monomer with a dimer or a homopolymer comprising a larger number of repeat units such as, for example, a pentamer, a hexamer, or larger homopolymeric entities. The outer polymeric shell may also be derived by the reaction of a homopolymer with another homopolymer if desired. The outer polymeric shell may also be crosslinked if desired. The crosslinking may occur during or after the polymerization. In the preparation of the outer polymeric shell, a monomer or a reactive species having a larger number or repeat units are reacted in the presence of the cores and a non-aqueous solvent to form a coating on the cores. The reaction may be brought about by the presence of a catalyst or an initiator. The reaction may alternatively be self-catalyzed if desired. The reaction can occur by addition polymerization, condensation polymerization, free radical polymerization, or a combination comprising at least one of the foregoing methods of polymerization. Variants of free radical polymerization such as emulsion polymerization and ionic polymerization may also be conducted to form a coating on the particle cores.

Examples of suitable monomers that may be used to derive the outer polymeric shell are selected from at least one of silicon containing compounds (e.g., silanes, cyclic siloxanes); metal containing compounds (e.g., tributyl tin methacrylate, vinyl ferrocene); nitroso containing compounds (e.g., tri-fluoro-nitrosomethane); aromatic or (cyclo) aliphatic esters (e.g., diallyl pththalates); aromatic compounds substituted by hetero atoms/groups (e.g., bisphenol allylether, cinnamic acid, coumarone, vinyl benzene sulfonic acid, chloromethyl styrene, vinyl benzoate); alkenyl aromatic compounds or aromatic compounds substituted by hydrocarbyl groups (e.g., divinylbenzene, divinyltoluene, vinyl toluene, styrene, alpha-methyl styrene); (cyclo)aliphatic nitriles (e.g., acrylonitrile, cyanoacrylic acid, cyanoacrylates, vinylidene cyanide); (cyclo)aliphatic aldehydes or ketones (e.g., acrolein, diacetone acrylamide); (cyclo)aliphatic carboxylic acids, anhydrides or salts (acrylic acid, maleic anhydride, acrylic anhydrides); alcohols (e.g., methanol, ethanol, propanol, dihydric and polyhydric alcohols, ethylene glycol, pentaerythritol, cyclohexane dimethanol); cycloaliphatic alcohols (e.g., allyl alcohol); (cyclo)aliphatic carboxylic esters (e.g., methyl methacrylate, vinyl acetate, dibutyl maleate, aminoalkyl acrylates); (cyclo) aliphatic halides (e.g., vinylidene chloride, tetrafluoroethylene, fluoroacrylates); (cyclo)aliphatic hydrocarbons (e.g., ethylene, propylene, tetrafluoroethylene, diisobutylene, norbornene); (cyclo)aliphatic hydrocarbons substituted with hydrocarbyl groups (e.g., butadiene, isoprene, allene, dicyclopentadiene, piperylene); triazines (e.g., melamines, guanamines); isothiocyanates (toluene diisocyanate, isophorone diisocyanate); amides (e.g., ureas); lactams or amino acids (e.g., caprolactam, aminocaproic acid, glutamic acid); amines (aniline, hexamethylene diamine, hexamethylene tetramine, piperidene, ethylene imine); mono-epoxy compounds (epihalohydrin, ethylene oxide, monoglycidyl ether/ ester; glycidol, thiiranes); cyclic ethers (e.g., tetrahydrofuran); aldehydes; ketones; cyclic thioethers; phenols (monohydric phenols, polyhydric phenols, cresols, resorcinol, bisphenol A); compounds containing carbon-carbon double bonds (trimethylolpropane triacrylate, diallyl maleate, pentaerythritol tetraacrylate); compounds containing carbon-carbon triple bonds (acetylene, propargyl alcohol); compounds containing both carbon-carbon double and carbon-carbon triple bonds (e.g., vinyl acetylene, dimethyl vinyl ethynyl carbinol); and combinations comprising at least one of the foregoing monomers.

Preferred monomers that may be used to derive the outer polymeric shell are selected from acrolein, acrylic acid, acrylonitrile, adipic acid, bisphenol A, butadiene, caprolactam, chloroprene, diethyl or dimethyl terephthalate, ethyl acrylate, ethylene, ethyl methacrylate, formaldehyde, hexamethylene diamine, isobutene, isoprene, maleic anhydride, melamine, methacrylic acid, 2-hydroxyethyl (meth)acrylate, methyl(meth)acrylate, methyl styrene, styrene, divinylbenzene, 2,6-naphthalene dicarboxylic acid, phenol, phthalic anhydride, propylene, sebacic acid, styrene, terephthalic acid, tetrafluoroethylene, urea, vinyl acetate, vinyl chloride, vinylidene chloride and a combination comprising at least one of the foregoing monomers.

Another preferred monomer is an allylic monomer. An allylic monomer is an organic compound comprising at least one, preferably at least two, more preferably at least three allyl (—CH$_2$—CH═CH$_2$) groups. Suitable allylic monomers include, for example, diallyl phthalate, diallyl isophthalate, triallyl mellitate, triallyl mesate, triallyl benzenes, triallyl cyanurate, triallyl isocyanurate, mixtures thereof, partial polymerization and products prepared therefrom.

Suitable polyolefins that may be used in the outer polymeric shell include linear low density polyethylene (LLDPE), low density polyethylene (LDPE), high density polyethylene (HDPE), very low density polyethylene (VLDPE), polypropylene (PP), poly ethylene vinyl acetate (PEVA), polyethylene vinyl alcohol (PEVOH), polyethylene propylene diene (PEPD), ethylene propylene rubber (EPR), and combinations comprising at least one of the foregoing polyolefins. Polyolefins used in the manufacture of the outer polymeric shell may be obtained by Zeigler-Natta based polymerization processes or by single site initiated (metallocene catalysts) polymerization processes. As noted above, these polymerizations are carried out in the presence of the particle cores.

Blends of other polyolefins such as low density polyethylene, high density polyethylene, linear low density polyethylene, polystyrene, polyvinyl chloride, polyamides, polyacrylics, celluloses, polyesters, and polyhalocarbons may also be used in the outer polymeric shell. Copolymers of ethylene with propylene, isobutene, butene, hexene, octene, vinyl acetate, vinyl chloride, vinyl propionate, vinyl isobutyrate, allyl alcohol, allyl acetate, allyl acetone, allyl benzene, allyl ether, ethyl acrylate, methyl acrylate, methyl methacrylate, acrylic acid, and methacrylic acid may also be used in the outer polymeric shell. Various polymers which find wide application in peroxide-cured or vulcanized rubber articles may also be used in the outer polymeric shell, such as, for example, polychloroprene, polybutadiene, polyisoprene, poly(isobutylene), nitrile-butadiene rubber, styrene-butadiene rubber, chlorinated polyethylene, chlorosulfonated polyethylene, epichlorohydrin rubber, polyacrylates, butyl or halo-butyl rubbers, or the like, or combinations comprising at least foregoing polymer resins.

The polyolefins used in the outer shell may or may not be crosslinked. Cross-linking of polyolefins with any additional polymers such as, for example, those listed above, may be effected through several known methods including: (1) use of free radicals provided through the use of organic peroxides or electron beam irradiation; (2) sulfur cross-linking in standard EPDM (rubber) curing; (3) and moisture curing of silane-grafted materials. Suitable chemical cross-linking agents include, but are not limited to, organic peroxides, preferably alkyl and aralkyl peroxides. Examples of such peroxides include: dicumylperoxide, 2,5-dimethyl-2,5-di(t-butylperoxy)hexane, 1,1-bis(t-butylperoxy)-3,3,5trimethyl-cyclohexane, 1,1-di-(t-butylperoxy)-cyclohexane, 2,2'-bis(t-butylperoxy) diisopropylbenzene, 4,4'-bis(t-butylperoxy) butylvalerate, t-butyl-perbenzoate, t-butylperterephthalate, and t-butyl peroxide. Most preferably, the cross-linking agent is dicumyl peroxide (Dicup) or 2,2'-bis(t-butylperoxy) diisopropylbenzene (Vulcup).

Chemically cross-linked outer polymeric shells can be achieved with the addition of multi-functional monomeric species, often referred to as "coagents". Suitable examples of coagents suitable for use in chemical cross-linking include di- and tri-allyl cyanurates and isocyanurates, alkyl di- and tri-acrylates and methacrylates, zinc-based dimethacrylates and diacrylates, and 1,2-polybutadiene resins.

A preferred aromatic polyester is a polyarylate. Polyarylates generally refers to polyesters of aromatic dicarboxylic acids and bisphenols. Polyarylate copolymers that include carbonate linkages in addition to the aryl ester linkages, are termed polyester-carbonates, and may also be advantageously utilized in the mixtures. The polyarylates can be prepared in solution or by the melt polymerization of aromatic dicarboxylic acids or their ester forming derivatives with bisphenols or their derivatives.

The polymer precursor is present in the reactive dispersion an amount of 0.01 to 5 wt %, based on the total weight of the reactive dispersion. In one embodiment, the polymer precursor is present in the reactive dispersion in an amount of 0.1 to 3 wt %, based on the total weight of the reactive dispersion. In another embodiment, the polymer precursor is present in the reactive dispersion in an amount of 0.2 to 2 wt %, based on the total weight of the reactive dispersion. In yet another embodiment, the polymer precursor is present in the reactive dispersion in an amount of 0.4 to 1 wt %, based on the total weight of the reactive dispersion.

As noted above, the polymer precursor undergoes a reaction to form a polymer. The polymer adsorbs onto the surface of the particle core during and after polymerization to form the polymer-coated particle. The polymer-coated particles are then used in a polishing composition.

The polymers that may be obtained from the polymerization of the polymer precursors are thermoplastic polymers, thermosetting polymers, blends of thermoplastic polymers, blends of thermosetting polymers, or blends of thermoplastic polymers with thermosetting polymers. The organic polymers may also be a blend of polymers, copolymers, terpolymers, interpenetrating network polymers or combinations comprising at least one of the foregoing organic polymers. Examples of thermoplastic polymers include polyacetals, polyurethanes, polyolefins, polyacrylics, polyester carbonates, polyalkyds, polystyrenes, polyesters, polyamides, polyaramides, polyamideimides, polyarylates, polyarylsulfones, polyethersulfones, polyphenylene sulfides, polysulfones, polyimides, polyetherimides, polytetrafluoroethylenes, polyetherketones, polyether etherketones, polyether ketone ketones, polybenzoxazoles, polyoxadiazoles, polybenzothiazinophenothiazines, polybenzothiazoles, polypyrazinoquinoxalines, polypyromellitimides, polyquinoxalines, polybenzimidazoles, polyoxindoles, polyoxoisoindolines, polydioxoisoindolines, polytriazines, polypyridazines, polypiperazines, polypyridines, polypiperidines, polytriazoles, polypyrazoles, polycarboranes, polyoxabicyclononanes, polydibenzofurans, polyphthalides, polyacetals, polyanhydrides, polyvinyl ethers, polyvinyl thioethers, polyvinyl alcohols, polyvinyl ketones, polyvinyl halides, polyvinyl nitriles, polyvinyl esters, polysulfonates, polysulfides, polythioesters, polysulfones, polysulfonamides, polyureas, polyphosphazenes, polysilazanes, or a combination comprising at least one of the foregoing organic polymers.

It is generally desirable for the aforementioned polymers to have functional groups that may be advantageously used for affecting polishing performance. For example, functional groups may affect selectivity, removal rate, dishing or planarization of semiconductor substrate layers during polishing. The functional groups may also be used for providing compatibility or dispersibility with the non-aqueous solvent or with the particle cores during the reaction, during the manufacturing of the polishing composition or during the polishing process. The functional groups may be covalently bonded to the polymer backbone or to pendant groups that are covalently bonded to the polymer backbone. Examples of suitable functional groups are selected from at least one of bromo groups, chloro groups, iodo groups, fluoro groups, amino groups, peroxide groups, perchlorate groups, perbromate groups, perhalogenated groups, perchlorous groups, hydroxyl groups, thio groups, phosphino groups, alkylthio groups, cyano groups, nitro groups, amido groups, carboxyl groups, aryl groups, heterocyclyl groups, ferrocenyl groups, heteroaryl groups, alkyl groups, aryl groups, alkaryl groups, aralkyl groups, fluoro substituted alkyl groups, ester groups, ketone groups, carboxylic acid groups, alcohol groups, fluoro-substituted carboxylic acid groups, fluoro-alkyl-triflate groups, and a combination comprising at least one of the foregoing functional groups.

The amount of surface coverage provided by the outer polymeric shell, the thickness of the outer polymeric shell and the shell's polymerization efficiency, selectivity can be used to control polishing performance, such as, erosion, selectivity, defectivity, planarization efficiency and removal rate. It can be used to reduce scratching of the surface if desired. The outer polymeric shell covers at least a portion of the particle core. As noted above, the outer polymeric shell may be crosslinked if desired. Optionally, the outer polymeric shell may comprise polymers that are covalently bonded to the particle core. Preferably, the shell has a physisorbed structure to facilitate manufacturability of the polymer-coated particles. It is desirable for the outer polymeric shell to cover the surface of the particle core in an average amount of greater than or equal to 50%, preferably greater than or equal to 75%, more preferably greater than or equal to 85%, and most preferably greater than or equal to 95%. It is desirable for the average thickness of outer polymeric shell to be greater than or equal to 0.1 nm, preferably greater than or equal to about 1 nm, and more preferably greater than or equal to about 5 nm.

The non-aqueous solvent for the reaction is selected for its ability to be compatible towards the cores as well as the monomers, for its ability to facilitate the reaction, as well as for its ability to facilitate the adsorption or absorption of the resultant polymers on the cores. Suitable non-aqueous solvent comprises polar liquids, non-polar liquids, ionic liquids, or a combination comprising at least one of the foregoing liquids. Generic examples of suitable polar liquids are alcohols, esters, ketones, ethers, amines, thiols, thioesters, sulfides, anisoles, or a combination comprising at least one of the foregoing polar liquids. Specific examples of suitable polar liquids are water, acetone, propylene carbonate, ethylene carbonate, butyrolactone, dimethyl formide, dimethyl sulfoxide, acetonitrile, benzonitrile, methylene chloride, nitromethane, nitrobenzene, sulfolane, dimethylformamide, N-methylpyrrolidone, methanol, acetonitrile, nitromethane, ethanol, propanol, isopropanol, butanol, diethyl ether, tetrahydrofuran, or combinations comprising at least one of the foregoing polar solvents. Examples of suitable non-polar liquids are hydrocarbons such as benzene, toluene, xylene, hexane, carbon tetrachloride, cyclohexane, heptane, petroleum ether, paraffin wax, or combinations comprising at least one of the foregoing non-polar solvents. Suitable examples of ionic liquids are imidazolium, pyridinium derivatives, phosphonium or tetralkylammonium compounds, or a combination comprising at least one of the foregoing ionic liquids. Co-solvents that comprise combinations of polar liquids, combinations of non-polar liquids and co-solvents comprising at least one polar liquid and at least one non-polar liquid may also be utilized to modify the solubility of the media.

The non-aqueous solvent may comprise a single liquid or multiple liquids. After the polymerization reaction, preferably removing the supernatant captures the fine coated particles. Then, the liquid may be replaced by azeotropic distillation, reverse osmosis or any other separation method and replaced with water. Although it is possible to separate the supernatant directly from the non-aqueous solvent, preferably, removal of the supernatant occurs after transfer to an aqueous-based solution. When divinylbenzene is used as the monomer, an alcohol (e.g., isopropanol, butanol) is the preferred non-aqueous solvent during the reaction. After the reaction, the alcohol is gradually replaced with water. This is called a fluid transfer. Residual alcohol from the fluid transfer process appears to facilitate the subsequent dispersion of the polymer-coated particles in an aqueous-based polishing composition.

The non-aqueous solvent is present in the reactive dispersion in an amount of 50 to about 99.9 wt %, based on the total weight of the reactive dispersion. In one embodiment, the non-aqueous solvent is present in the reactive dispersion in an amount of 70 to about 99 wt %, based on the total weight of the reactive dispersion. In another embodiment, the non-aqueous solvent is present in the reactive dispersion in an amount of 80 to about 98 wt %, based on the total weight of the reactive dispersion. In yet another embodiment, the non-aqueous solvent is present in the reactive dispersion in an amount of 90 to about 96 wt %, based on the total weight of the reactive dispersion.

As noted above, initiators and catalysts may also be used to polymerize the reaction of the polymer precursors. Examples of suitable initiators and catalysts that may be used to polymerize the reaction of the polymer precursors are at least one selected from peroxides (e.g., hydroperoxides); persalts (potassium persulfate); azo compounds (e.g., azobisisobutyronitrile); free radical and redox catalysts (e.g., ammonium persulfate, ferrous sulfate, ceric ammonium nitrate); Friedel Crafts catalysts and Lewis acids (e.g., boron tirfluoride ($BF_3$), aluminum trichloride ($AlCl_3$), tin chloride ($SnCl_4$), iron trichloride ($FeCl_3$), sulfuric acid ($H_2SO_4$), phosphoric acid ($H_3PO_4$)); metallocene catalysts; transition metal catalysts; and a combination comprising at least one of the foregoing. Typical initiators include free radicals, anionic and cationic initiators consumed in the polymerization process. When divinylbenzene is used as the polymeric precursor, benzoyl peroxide is preferably used as the initiator. The use of an initiator improves thickness control of the outer polymer shell. For example, increasing the amount of initiator may increase the thickness of the polymer coating. Furthermore, delaying the introduction of the initiator can also improve the polymer coating's integrity. Optionally, it is possible to introduce the initiator in two or more steps to influence the thickness and morphology of the polymer coating.

In one embodiment, in one method of making the polymer coated abrasive particles, the particle cores comprising silica or alumina are placed in a non-aqueous solvent comprising a first liquid and a second liquid. The ratio of the first liquid to the second liquid may be adjusted to facilitate compatibilization of the polymer with the non-aqueous solvent. This ratio may also be adjusted to facilitate the compatibilization of the polymer with the particle cores. When divinylbenzene is used as the polymer precursor, the first liquid is advantageously alcohol while the second liquid is advantageously water. The polymer precursor comprising divinylbenzene monomer is added to the non-aqueous solvent along with the initiator. The reactive dispersion may be agitated during the reaction. The temperature may also be varied during the reaction. The divinylbenzene undergoes polymerization to form polydivinylbenzene and is deposited onto the particle cores to form an outer polymeric shell.

In another embodiment, in another method of making the abrasive particles, the particle cores comprising silica or alumina are placed in a non-aqueous solvent comprising only a first liquid. When divinylbenzene is used as the polymer precursor, the first liquid is advantageously alcohol. The polymer precursor comprising divinylbenzene monomer is added to the non-aqueous solvent along with the initiator. The reactive dispersion may be agitated during the reaction. The temperature may also be varied during the reaction. The divinylbenzene undergoes polymerization to form polydivinylbenzene and is deposited onto the particle cores to form an outer polymeric shell. In one embodiment, after the formation of the outer polymeric shell, the alcohol may be distilled off and replaced with a second liquid. A preferred second liquid is deionized water. In another embodiment, after the formation of the outer polymeric shell, the reactive mixture may be centrifuged, the supernatant extracted from the centrifuge and subjected to distillation to replace the alcohol with a second liquid. The preferred second liquid is deionized water. It is to be noted that in place of the centrifuging, other separation processes such as filtration or reverse osmosis may be used.

During the reaction, the polymer precursor, the particle cores, and the initiator may be added simultaneously or sequentially. In one embodiment, in order to control the structure of the polymer formed or the thickness of the outer polymeric shell the initiator and the polymer precursor may be added in steps. For example, the polymer precursor may be added in a first step along with a portion of the initiator. After the reaction has progressed to a certain extent, additional initiator or polymer precursor may be added in a second step. The rate of addition of the initiator may be used to control the thickness of the polymer coating. Similarly, additional polymer or polymer precursor may be added in a third step. Optionally, if desired, a different polymer precursor may be added to the reactive dispersion during one of the steps to form a copolymer.

In one embodiment, the concentration of the non-aqueous solvent may also be changed during the reaction, if desired. Changing the concentration of the non-aqueous solvent can be undertaken to increase the deposition rate of the polymer onto the surface of the particle cores or to change the structure of the polymer. For example, in the aforementioned reaction involving divinylbenzene, during the reaction, additional alcohol may be added to the reactive dispersion. This addition may also be carried out in steps if desired. In another embodiment, a third or a fourth liquid may be added to the reactive dispersion prior to the reaction, during the course of the reaction, or after the reaction. The addition of the third or fourth liquids is undertaken to facilitate compatibilization, change the rate of reaction, change the structure or the crosslink density of the outer polymeric shell, change the thickness of the outer polymeric shell.

One advantageous feature of conducting the reaction in the manner described above is that there is no need to dry the particles after the deposition of the outer polymeric shell upon the surface of the particle cores. The drying of the particles prior to manufacturing the polishing composition promotes agglomeration of the coated particle cores. This is highly undesirable as the agglomerated particles have large sizes (i.e., greater than 1000 nanometers) are generally uneven in size. In yet another advantageous feature related to this method of forming the outer polymeric shell, the alcohols that are adsorbed into the shell facilitate compatibility with water and hence make the particles more dispersible in water. The reactive dispersion, after the reaction, can be converted to a polishing composition by adding additional water or other desirable liquids, oxidizing agents, compatibilizing agents, chelating agents. A second abrasive comprising uncoated abrasive particles may optionally be added to the polishing composition.

Typically, polishing solutions will contain 0.1 to 50 weight percent polymer-coated abrasive. In addition, the polishing composition may optionally include a second abrasive to facilitate "mechanical" removal of cap layers and barrier layers. The abrasive is preferably a colloidal abrasive and may be uncoated if desired. Suitable examples of abrasives include the following: inorganic oxide, inorganic oxides having hydroxide coatings, metal boride, metal carbide, metal nitride, or a combination comprising at least one of the foregoing abrasives. Suitable inorganic oxides include, for example, silica ($SiO_2$), silica particles coated with aluminum hydrous oxide, ellipsoidal particles of different anisometry coated with silica, silica particles coated with ceria hydroxide particles, alumina ($Al_2O_3$), titania ($TiO_2$), zirconia ($ZrO_2$), ceria ($CeO_2$), manganese oxide ($MnO_2$), alumina coated with silica, titania coated with zirconia and combinations comprising at least one of the foregoing inorganic oxides. Diamond may also be utilized as an abrasive if desired. Alternative abrasives also include polymeric particles and coated polymeric particles. The preferred abrasive is colloidal silica.

The polishing composition may also include an oxidizing agent for facilitating the removal of non-ferrous metal interconnects such as aluminum, aluminum alloys, copper, copper alloys, gold, gold alloys, nickel, nickel alloys, platinum group metals, platinum group alloys, silver, silver alloys, tungsten and tungsten alloys or combinations comprising at least one of the foregoing metals.

The polishing composition also advantageously comprises a corrosion inhibitor, also commonly termed a film-forming agent. The preferred corrosion inhibitor is benzotriazole (BTA). Optionally, a supplementary corrosion inhibitor may be added to the polishing composition. Supplementary corrosion inhibitors are surfactants such as, for example, anionic surfactants, nonionic surfactants, amphoteric surfactants and polymers, or organic compounds such as azoles.

It is generally preferred to use the polishing composition on semiconductor substrates having non-ferrous interconnects. Suitable metals used for the interconnect include, for example, aluminum, aluminum alloys, copper, copper alloys, gold, gold alloys, nickel, nickel alloys, platinum group metals, platinum group alloys, silver, silver alloys, tungsten and tungsten alloys or combinations comprising at least one of the foregoing metals. The preferred interconnect metal is copper.

The coated particles are advantageous in that they do not agglomerate during storage or during polishing. The coated particles are also advantageous in that, when the outer polymeric shell is crosslinked, the process of polishing does not facilitate a rapid separation or removal of the coating from the particle cores. This feature promotes reproducible results during polishing. The reactive dispersion containing the coated particles can be advantageously subjected to chemical processes such as distillation, centrifugation, reverse osmosis, filtration, during the manufacturing of the polishing composition, without damaging the coated particles and without promoting any further agglomeration of the particles.

The polymer-coated particles will operate in various fluid media, such as aqueous-base liquids and non-aqueous liquids. The polishing composition enables the polishing apparatus to operate with a low pressure of less than 21.7 kPa (3 psi). Most preferably, the polishing occurs with the polishing pad and conditions of the Example shown below. The low polishing pad pressure improves polishing performance by reducing scratching and other undesired polishing defects and reduces damage to fragile materials such as the low k and ultra-low k dielectrics.

Some embodiments of the invention will now be described in detail in the following Examples.

EXAMPLES

Comparative Example A

Functionality with poly(2-hydroxyethyl methacrylate)

First, placing 25 g of abrasive particles (silica or alumina as received in aqueous slurry) into a 250 ml polypropylene container and adding sec-butanol in 3:1 ratio of alcohol to water formed the initial dispersion. Shaking the dispersion for up to 5 minutes and allowing coarse particles to settle and decanting a top clear liquid layer without disturbing and removing any settled particles provided for an initial removal of coarse core particles.

This comparative example then followed the following steps: add more sec-butanol and shake again; mark flask for 500 ml volume; add mixture of particles and alcohol to reaction flask apparatus already set up; wash out bottle with more alcohol and bring total reaction liquid volume up to 500 ml per 25 grams of particles; heat the reaction mixture while stirring and allow excess water to be removed via boiling off the water/alcohol azeotrope (the azeotrope boiling point is 89° C.); continuously add sec-butanol to keep reaction volume constant; when the temperature reaches 99° C. (all water has been removed), place a condenser in one flask joint and place a stopper in the other flask joint; begin refluxing the resulting mixture; when mixture begins refluxing, add 2.5 g divinylbenzene monomer to reaction; wait 2 hours and add 0.25 g benzoyl peroxide initiator for reaction in a 10:1 weight ratio of monomer to initiator; continue refluxing; add 1.0 g 2-hydroxyethyl methacrylate monomer 2 hours after initiator addition; total reflux time 12 hours; allow reaction to cool and observe whether any particles settle; if clear supernatant liquid appears due to coagulation and settling, draw that liquid off for lower volume to centrifuge; and isolate particles and dry in vacuum oven at 100° C.

The resulting particles were polydivinylbenzene grafted with an outer layer of poly(2-hydroxyethyl methacrylate) possessing a functional hydroxyl group. The total amount of polymer coating was approximately 5 weight percent. Unfortunately, the resulting particles had an agglomerated structure, were difficult to disperse in aqueous compositions and provided little or no benefit to chemical mechanical polishing.

Comparative Example B

Thickness

This test relied upon a similar process to polymer coat particle cores. The recipe was as follows: place 25 g of silica particles (as received in aqueous slurry) into a 250 ml polypropylene container; add sec-butanol in 3:1 ratio of alcohol to water; shake solution for up to 5 minutes and allow particles to settle; decant top clear liquid layer without disturbing and removing any settled particles; add more sec-butanol and shake again. Mark flask for 500 ml volume; add mixture of particles and alcohol to reaction flask apparatus already set up; wash out bottle with more alcohol and bring total reaction liquid volume up to 500 ml per 25 grams of particles; heat the reaction mixture while stirring and allow excess water to be removed via boiling off the water/alcohol azeotrope (the azeotrope boiling point is 89° C.); continuously add sec-butanol to keep reaction volume constant—when the temperature reaches 99° C. (all water has been removed); place a condenser in one flask joint and place a stopper in the other flask joint; begin refluxing the resulting mixture; and when the mixture begins refluxing, add divinylbenzene monomer to the reaction; wait 2 hours and add appropriate initiator for reaction in a 10:1 weight ratio of monomer to initiator; continue refluxing for a total reflux time of 12 hours; allow reaction to cool and see if any particles settle; if clear supernatant liquid appears due to coagulation and settling, then draw that liquid off for lower volume to centrifuge; and isolate particles and dry in vacuum oven at 100° C.

Varying weight ratios of particles to monomer can control the final coating thickness. For example, a 10:1 weight ratio of particles to monomer to achieve a 5 weight percent coating. Unfortunately, the resulting particles had an agglomerated structure, were difficult to disperse in aqueous compositions and provided little or no benefit to chemical mechanical polishing.

Example 1

Polymer-coated Particles

This test relied upon a liquid-to-liquid transfer process to polymer coat particle cores. The recipe was as follows: place 2678.34 ml IPA in a three-necked 4 L flask; add 471.66 g silica IPA dispersion (25 g silica by weight from a 31.8% stock dispersion in IPA from Clariant)—two Teflon paddle blades attached to a glass shaft for mixing; add 50.28 g divinylbenzene monomer to the reaction mixture and allow the reaction mixture to stir at room temperature for 2 hours; add 5.02 g benzoyl peroxide initiator to the reaction mixture while stirring; heat the reaction mixture to reflux; make four additions of 37.55 g divinylbenzene monomer and 3.75 g benzoyl peroxide initiator after 3, 6, 9 and 12 hours; reflux for 6 hours after the final addition—total reflux time is 18 hours; cool the reaction mixture and transfer the contents to a Nalgene plastic bottle; ultracentrifuge the reaction mixture at 1,000 RPM for 35-40 minutes; decant the resulting supernatant into a 12 L three-necked bottle (This supernatant can be further concentrated if desired prior to the following solvent transfer by heating under constant mixing to distill off IPA to the desired amount.); when the supernatant consists of 30-40% solids, add DI water in sequential increments until all IPA has been removed by azeotropic distillation; when the temperature of the distilling solvent reaches 100° C., assume that all IPA has been removed and water is the only liquid component and allow the resulting aqueous dispersion containing coated silica is allowed to cool and collect into a Nalgene container; agitate the stirred dispersion from above using ultrasonic probe for the period of 5 minutes (100 g dispersion per run); then centrifuge the dispersion at 1,000 RPM for 15 minutes; and collect the resulting supernatant by vacuum siphoning into a Nalgene bottle.

The resulting particles were unimodal-monodispersible in water, contained 19 wt % polymer and facilitated chemical mechanical polishing.

Example 2

Centrifuge of Polymer-coated Particles

This example was undertaken to demonstrate the method of coating particle cores. In this example, divinylbenzene was polymerized using benzoyl peroxide initiator. The polymerization reaction was conducted in isopropanol that contained uncoated silica particle cores. After the reaction, a liquid transfer was undertaken by azeotopic distillation to replace the isopropanol from the reactive dispersion with water.

An addition of 441.66 milliliters (mL) of isopropanol (IPA) was added to a three-necked 1 liter (L) flask. Then adding 83.34 grams (g) of a silica particle cores (25 g silica particles by weight from a 30% stock dispersion in IPA). The silica dispersion supplied from Clariant and contained 13 nm particles in the IPA. A Teflon paddle blade attached to a glass shaft maintained the dispersion. While mixing the dispersion, 2.5 g of monomer (divinylbenzene) was added to the reaction mixture and the reaction mixture was stirred at room temperature for a total of 2 hours. In addition, 0.25 g of initiator (benzoyl peroxide) was added to the reaction mixture while stirring. The divinylbenzene reacted to form polydivinylbenzene (PDVB) and coat the silica particle cores with the PDVB. The reaction mixture was heated and allowed to reflux for 12 hours, following that it was cooled and transferred to a 500 ml Nalgene bottle. The reactive dispersion was then centrifuged at 5,000 RPM for 1 hour. The resultant supernatant was decanted into a Nalgene plastic bottle and the remaining solids were dried in a vacuum oven at 50° C.

Two different samples were obtained from the aforementioned procedure. The first sample (A) was prepared as follows. The uncentrifuged reaction mixture was distilled until the reactive dispersion contained 30 to 40 wt % solids. Deionized water was then added in sequential increments until all the IPA was removed by distillation. The resulting dispersion contained 17.0 wt % coated $SiO_2$ and was collected into a Nalgene plastic container. The resulting dispersion and particles in the dispersion were dried in a vacuum oven at 50° C. and are analyzed below.

The second sample (B) was prepared by taking the supernatant from the centrifuged reaction material and placing it into a 1 L three-necked flask. The mixture containing the supernatant was distilled until the reactive dispersion contains 30 to 40 wt % solids. Deionized water was then added in sequential increments until all the IPA was removed by distillation. The resulting dispersion contained 17.0 wt % coated $SiO_2$ and was collected into a Nalgene plastic container. The resulting dispersion and particles in the dispersion dispersion were dried in a vacuum oven at 50° C. and are analyzed below.

The resulting particles were analyzed by light scattering using a APV instrument, manufactured by ALV-Laser Vertriebsgesellschaft m.b.H, Robert-Bosch-Straβe 46, D-63225 Langen, Germany. The samples were first diluted to a solids content of about 1 wt %, prior to making the measurements. Five measurements for each sample were made. The average of the five readings are shown in the Table 1 below.

TABLE 1

| Description | Average Particle size (nm) |
|---|---|
| Core Particles | 13 |
| PDVB coated particles in IPA prior to centrifuging Sample A | 242 |
| PDVB coated particles after phase transferring to DI water Sample B | 33.5 |
| PDVB coated particles before phase transferring into the DI water | 18.5 |
| PDVB coated particles after phase transferring into the DI water | 20 |

From the aforementioned table, it may be seen that the addition of the PDVB coating to the particles increases the average particle size. Further it may be seen that the presence of the surrounding non-aqueous solvent makes a difference to the average particle size.

Thermogravimetric analysis (TGA) conducted on the samples shows that sample A had a weight loss of 5.7 wt %, indicating that sample A had a coating of about 5.7 wt % PDVB on the particles. Sample B displayed a weight loss of 2.7 wt %, indicating that sample B had a coating of about 2.7 wt % PDVB on the particles.

Example 3

Polishing

This example was undertaken to demonstrate the use of silica particle cores coated with polydivinylbenzene. The nomenclature for the materials used in the polishing compositions for the following examples are shown in Table 2 below. The polishing compositions comprise 1 wt % of silica particle cores coated with a polymer. The pH of the polishing solution was 3.4.

TABLE 2

| Nomenclature | Name |
|---|---|
| QRXP-1667 (23K) | Rohm and Haas copolymer of polyacrylic acid and methacrylic acid having a molecular weight 23,000 g/mole. |
| Copolymer 9585 (200K) | Rohm and Haas copolymer of polyacrylic acid and methacrylic acid having a molecular weight 200,000 g/mole. |
| Polymer Coated Silica B | 3 wt % coating of PDVB on silica |
| Polymer Coated Silica C | 1 wt % coating of PDVB on silica |
| Polymer Coated Silica D | 7 wt % coating of PDVB on silica |
| CMC 7L1C1 | Carboxymethylcellulose manufactured by Hercules. |

Table 3 shows the various polishing compositions containing coated particles that were used in to polish a semiconductor wafer. Polishing experiments were performed using polishing equipment having model number IPEC 472. The polishing pad was an IC1000™ (Rohm and Haas Electronic Materials CMP Technologies) porous-filled polyurethane polishing pad. The pad was conditioned with a diamond conditioning disk from Kinik Company (model No. AD 3CG-181060) prior to each run. The polishing process was performed at a pressure of 1 psi (6.9 kPa), a table speed of 80 revolutions per minute (rpm) and a carrier speed of 75 rpm. The polishing composition supply rate (slurry flow rate) was 160 milliliters/minute (ml/min). All tests employed 200 mm wafers.

TABLE 3

| Sample # | BTA | Malic Acid | CMC 7L1C1 | QRXP-1667 (23K) | $(NH_4.2H PO_4)$ | Polymer coated silica B | Polymer coated silica C | Polymer coated silica D | $H_2O_2$ |
|---|---|---|---|---|---|---|---|---|---|
| 1 | 0.50 | 0.22 | 0.32 | 0.100 | 0.50 | 1.000 | | | 15 |
| 2 | 0.50 | 0.22 | 0.32 | 0.100 | 0.50 | | 1.000 | | 15 |
| 3 | 0.50 | 0.22 | 0.32 | 0.100 | 0.50 | | | 1.000 | 15 |

TABLE 4

| Sample # | pH | Copper RR (Angstroms/min) | Sheet RR | | Ratio to Cu | |
|---|---|---|---|---|---|---|
| | | | TaN | TEOS | TaN | TEOS |
| 1 | 3.4 | 2310 3007 | 200 | 11 | 12 | 214 |
| 2 | 3.4 | 2611 2618 | 185 | 24 | 14 | 110 |
| 3 | 3.4 | 3028 2887 | 129 | 3 | 24 | 953 |

The above Tables illustrate that the greater the coating of polymer on the silica particle, the better is the copper to TaN or copper to TEOS selectivity. For example, Sample #3 which has a 7 wt % coating of PDVB on silica shows a copper to TEOS ratio of 953, while Sample #1 which has a 3 wt % coating of PDVB on silica has a copper to TEOS ratio of 214. Thus by increasing the thickness of the polymer coating on the particle cores, there can be a significant increase in the selectivity displayed by the polishing solution.

What is claimed is:

1. A polishing composition suitable for chemical mechanical polishing magnetic, optical, semiconductor or silicon substrates comprising:
   abrasive particles in a liquid media, the abrasive particles having a particle core, the particle core having a hardness and a crosslink polymeric shell physisorbed to and encapsulating the particle core, the crosslinked polymeric shell having a solid crosslinked polymeric structure that encapsulates the particle core and a hardness lower than the hardness of the particle core; and wherein the abrasive particles have an average particle size of less than or equal to about 2 micrometers dispersed in the liquid media and the abrasive particles have hybrid polishing properties of the crosslinked polymeric shell and particle core, the hybrid polishing properties being different in comparison to polishing properties of the particle core and different in comparison to polishing properties of the crosslinked polymeric shell.

2. The composition of claim 1, wherein the crosslinked polymeric shell has a thickness of 0.1 to 30 nanometers.

3. The composition of claim 1, wherein the particle core comprises silica or alumina.

4. The composition of claim 1, wherein the crosslinked polymeric shell comprises a functional group.

5. The composition of claim 4, wherein the functional group is selected from at least one of bromo groups, chloro groups, iodo groups, fluoro groups, amino groups, hydroxyl groups, thio groups, phosphino groups, alkylthio groups, cyano groups, nitro groups, amido groups, carboxyl groups, aryl groups, heterocyclyl groups, peroxide groups, perchlorate groups, perbromate groups, perhalogenated groups, perchlorous groups, ferrocenyl groups, heteroaryl groups, alkyl groups, aryl groups, alkaryl groups, aralkyl groups, fluoro substituted alkyl groups, ester groups, ketone groups, carboxylic acid groups, alcohol groups, fluoro-substituted carboxylic acid groups, fluoro-alkyl-triflate groups and combinations comprising at least one of the foregoing functional groups.

6. A polishing composition suitable for chemical mechanical polishing magnetic, optical, semiconductor or silicon substrates comprising: abrasive particles in a liquid media, the abrasive particles having a particle core, the particle core having a hardness;
   a crosslinked polymeric shell physisorbed to and encapsulating the particle core, the crosslinked polymeric shell having a solid crosslinked polymeric structure that encapsulates the particle core, a hardness lower than the hardness of the particle core and a thickness of 0.5 to 20 nanometers; and wherein the abrasive particles have an average particle size of less than or equal to about 2 micrometers dispersed in the liquid media and the abrasive particles have hybrid polishing properties of the crosslinked polymeric shell and particle core, the hybrid polishing properties being different in comparison to polishing properties of the particle core and different in comparison to polishing properties of the crosslinked polymeric shell.

7. The composition of claim 6, wherein the crosslinked polymeric shell comprises polydivinylbenzene or polyhydroxyethyl(meth)acrylate with polydivinylbenzene.

8. The composition of claim 6, wherein the crosslinked polymeric shell has a thickness of 1 to 15 nanometers.

* * * * *